(12) United States Patent
Chiu

(10) Patent No.: US 7,511,372 B2
(45) Date of Patent: Mar. 31, 2009

(54) MICROELECTRONIC DIE COOLING DEVICE INCLUDING BONDING POSTS AND METHOD OF FORMING SAME

(75) Inventor: Chia-Pin Chiu, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/170,289

(22) Filed: Jun. 28, 2005

(65) Prior Publication Data

US 2006/0289987 A1    Dec. 28, 2006

(51) Int. Cl.
*H01L 23/10* (2006.01)
(52) U.S. Cl. ..................................... 257/706
(58) Field of Classification Search ................. 257/714, 257/706, 712, 678, E23.103
See application file for complete search history.

(56) References Cited

U.S. PATENT DOCUMENTS

| | | | | |
|---|---|---|---|---|
| 5,239,200 A | * | 8/1993 | Messina et al. | ............. 257/714 |
| 6,783,692 B2 | * | 8/2004 | Bhagwagar | .................. 252/70 |
| 6,890,799 B2 | * | 5/2005 | Daikoku et al. | ............. 438/122 |
| 6,934,154 B2 | * | 8/2005 | Prasher et al. | ............... 361/699 |
| 6,989,991 B2 | * | 1/2006 | Barson et al. | ................ 361/699 |
| 7,015,577 B2 | * | 3/2006 | Wang | .......................... 257/707 |
| 7,030,485 B2 | * | 4/2006 | Houle et al. | ................. 257/712 |
| 2006/0138644 A1 | * | 6/2006 | Houle et al. | ................. 257/706 |

* cited by examiner

*Primary Examiner*—Nathan W Ha
(74) *Attorney, Agent, or Firm*—Blakely, Sokoloff, Taylor & Zafman LLP

(57) ABSTRACT

A microelectronic assembly and a method of forming same. The microelectronic assembly comprises: a microelectronic package including a substrate and a die, the die being electrically conductively bonded to the substrate at a front side thereof and further having a backside; a cover plate defining an inlet opening and an outlet opening therethrough; bonding posts mechanically bonding the cover plate to the backside of the die; a sealant body sealingly bonding an inner periphery of a die side of the cover plate to an inner periphery of a backside of the die to form, along with the backside of the die and the cover plate, a cooling fluid chamber. The backside of the die, the cover plate, the bonding posts and the sealant body together define a microelectronic cooling device including the cooling fluid chamber and configured to receive cooling fluid through the inlet opening, to flow the cooling fluid in the chamber between the bonding posts, and to allow the cooling fluid to exit from the outlet opening to cool the die.

17 Claims, 6 Drawing Sheets

US 7,511,372 B2

MICROELECTRONIC DIE COOLING DEVICE INCLUDING BONDING POSTS AND METHOD OF FORMING SAME

FIELD

Embodiments of the present invention relate to thermal management of microelectronic packaging and dice, and, more particularly, to active cooling using electrokinetic fluid pumping through a cold plate.

BACKGROUND

A microelectronic package comprises a microelectronic die electrically interconnected with a carrier substrate, and one or more other components, such as electrical interconnects, an integrated heat spreader, a heat sink, among others. An example of a microelectronic package is an integrated circuit microprocessor. A microelectronic die comprises a plurality of interconnected microcircuits within a carrier to perform electronic circuit functions.

A microelectronic die generates heat as a result of the electrical activity of the microcircuits. In order to minimize the damaging effects of heat, passive and active thermal management devices are used. Such thermal management devices include heat sinks, heat spreaders, and fans, among many others. There are limitations in the use of each type of device, and in many cases, the thermal management device is specifically designed for a particular microelectronic die and package design and intended operation. Examples of passive thermal management devices include heat sinks and integrated heat spreaders. Examples of active thermal management devices include package-based liquid cooling system including a micro-channel cold plate (MCCP).

A conventional micro-channel cold plate (MCCP) is shown in FIGS. 1a and 1b. FIG. 1a shows a housing portion of a conventional MCCP from a top plan view, and FIG. 1b shows a cross-sectional view of the MCCP taken along a length thereof and mounted on a package. It is noted at the outset that the MCCP shown in FIGS. 1a and 1b is not to scale. As shown in FIGS. 1a and 1b, a MCCP 115 according to the prior art may include a housing 102 defining a cooling fluid chamber 103, and having a die-side housing portion 104 and a cover plate portion 106. FIG. 1a shows a top plan view of the die-side housing portion 104. As seen in FIG. 1a, according to the prior art, the die-side housing portion 104 of a MCCP 115 may include a plurality of micro-channels 105 extending in a direction parallel to one another. The micro-channels 105 are adapted to direct cooling fluid from an inlet side 108 of the housing 102 to an outlet side 110 of the housing 102 as shown. Examples of cooling fluids include water, antifreeze such as potassium formate and K-formate, oil, liquid metal, low-melting-temperature solder alloy, nanofluid (that is, fluid with nano-particles), air and helium. The housing 102 may be made of silicon or copper, and the micro-channels 105 may be etched into the silicon or copper die-side housing portion 104 or provided using micro-machining techniques according to well-known methods. The cooling fluid is adapted to be delivered to the inlet side 108 of housing 102 by way of an inlet opening 112 in cover plate portion 106, and to exit the outlet side 110 through an outlet opening 114 in cover plate portion 106. The cooling fluid may be pumped through the MCCP 115 by a pump in a conventional closed loop cooling system. As shown in FIG. 1b, the MCCP 115 may be mounted onto a package 116 through thermal interface material (TIM) 118 as shown to form an MCCP-package assembly 100. TIM 118 may include a thermal interface pad or thermal grease, solder or epoxy. Package 116 as shown include a die 120 bonded to substrate 122 via electrically conductive and mechanically bonding joints 124 as shown. By "joint," what is meant in the context of the instant description is a connection between the die and the substrate that is both electrically conductive and that further mechanically bonds the die to the substrate. Joints 124 are typically made of solder, and connect electrical contacts on the underside of the die 120 to corresponding electrical contacts on the substrate 122. Joints 124 as shown as encapsulated by a cured underfill material 126 as shown.

According to the prior art a MCCP 115 of which is depicted in FIGS. 1a and 1b, heat generated by the package 116 is dissipated at least in part through the MCCP 115 by circulating cooling fluid through micro-channels 105. The cooling fluid may be pumped through the cooling system by a pump and carried to a further heat sink device, such as, for example, a heat exchanger including fins, to dissipate heat energy from the cooing fluid 107 to the environment.

MCCP's according to the prior art disadvantageously require the use of lithographic and/or micro-machining techniques for providing the channels. Such techniques can be expensive, complicated and time-consuming to implement.

The prior art has as yet failed to provide a microelectronic die cooling device that is cost-effective, simple and efficient to fabricate.

BRIEF DESCRIPTION OF THE DRAWINGS

Embodiments of the invention are illustrated by way of example and not by way of limitation in the figures of the accompanying drawings, in which the like references indicate similar elements and in which.

DETAILED DESCRIPTION

A microelectronic die cooling device including bonding posts, a method of forming the device, and a system including the device are described herein.

Various aspects of the illustrative embodiments will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative embodiments. However, it will be apparent to one skilled in the art that the present invention may be practiced without the specific details. In other instances, well-known features are omitted or simplified in order not to obscure the illustrative embodiments.

Various operations will be described as multiple discrete operations, in turn, in a manner that is most helpful in understanding the present invention; however, the order of description should not be construed as to imply that these operations are necessarily order dependent. In particular, these operations need not be performed in the order of presentation.

The phrase "in one embodiment" is used repeatedly. The phrase generally does not refer to the same embodiment, however, it may. The terms "comprising", "having" and "including" are synonymous, unless the context dictates otherwise.

Figure 1A:
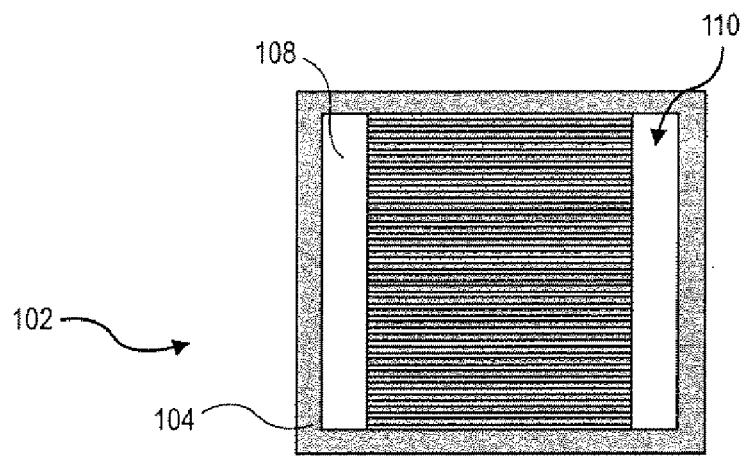
FIG. 1a depicts a microchannel-cold plate cooling chamber in top plan view according to the state of the art.
Figure 1B:
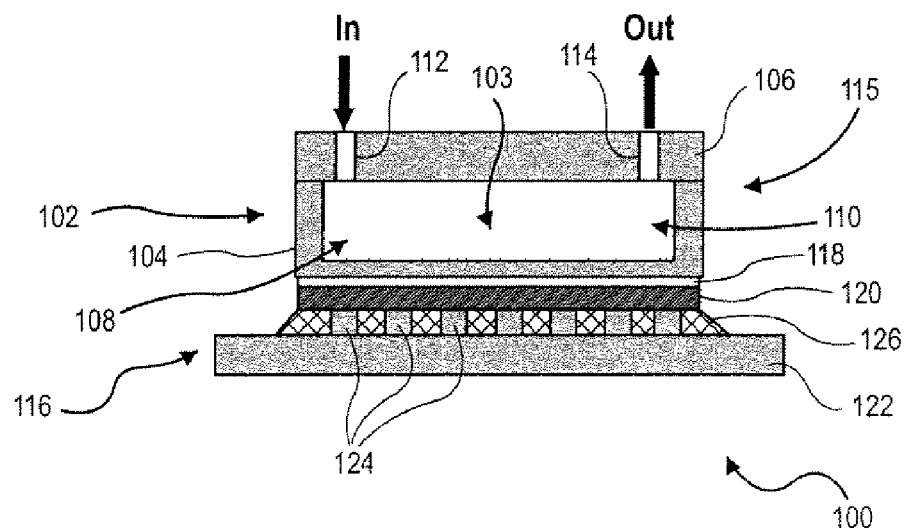
FIG. 1b is a cross sectional view of a microelectronic assembly including the microchannel cold plate of FIG. 1a according to the state of the art.
Figure 2:
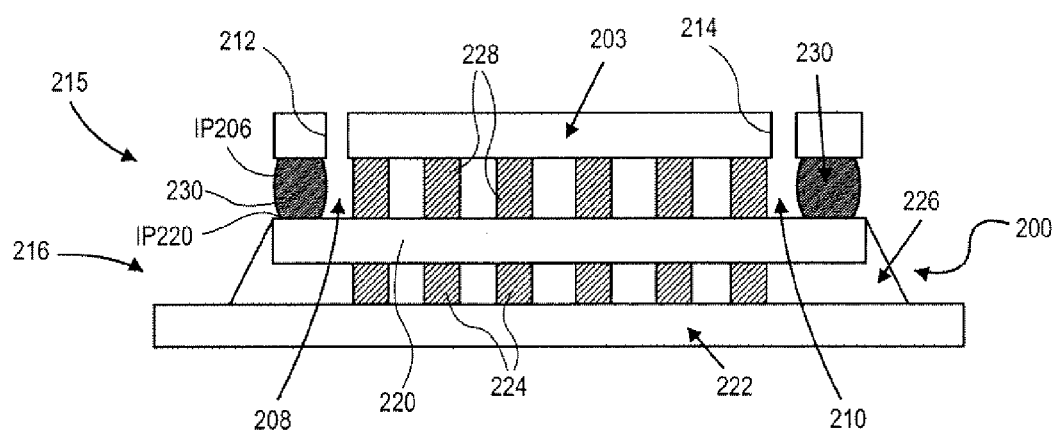
FIG. 2 depicts a microelectronic assembly including a bonding post cold plate according to a first embodiment.

Referring now to FIG. 2, an assembly 200 is shown according to a first embodiment of the present invention. As shown in FIG. 2, assembly 200 may include a package 216 comprising a die 220 bonded to a substrate 222 via electrically conductive and mechanically bonding joints 224 as shown. Bonding joints 224 may be made of solder, copper, tin, silver or gold, or alloys including any combination of tin, bismuth, lead and/or indium. Bonding joints 224 are configured to connect electrical contacts on the underside of die 220 to corresponding electrical contacts on the substrate 222. Joints 224 are encapsulated by a cured underfill material 226 as shown. A cover plate 206 may be provided which is mechanically bonded to a backside of die 220 by way of bonding posts 228. The cover plate 206 may be made of a material having a low coefficient of thermal expansion, such as, for example, silicon or glass. Bonding posts 228 may be made of any of the materials listed for joints 224 above. A sealant body 230 may be disposed between the cover plate 206 and the backside of the die 220 to form a sealing bond an inner periphery IP206 of cover plate 206 with a facing inner periphery IP220 of the backside of the die 220 as shown. By "sealing bond," what is meant in the context of the present invention is a fluid tight seal. A combination of the cover plate 206, die 220, and sealant body 230 may thus be configured to define a cooling fluid chamber 203 as shown. In addition, a combination of the cover plate 206, die 220, sealant body 230 and bonding posts 228 may be configured to define a microelectronic cooling device in the form of bonding post cold plate (BPCP) 215 adapted to cool the die 220. Thus, cooling fluid, such as, for example, water, antifreeze (e.g. potassium formate and K-formate), oil, liquid metal, low-melting-temperature solder alloy, nanofluid (that is, fluid with nano-particles), air or helium, may be adapted to pass through BPCP 215 by being delivered to an inlet side 208 of chamber 203 by way of an inlet opening 212 in cover plate 206, to flow within chamber 203 between bonding posts 228, and to exit an outlet side 210 of chamber 203 through an outlet opening 214 in cover plate 206 to cool the die.

Figure 3:
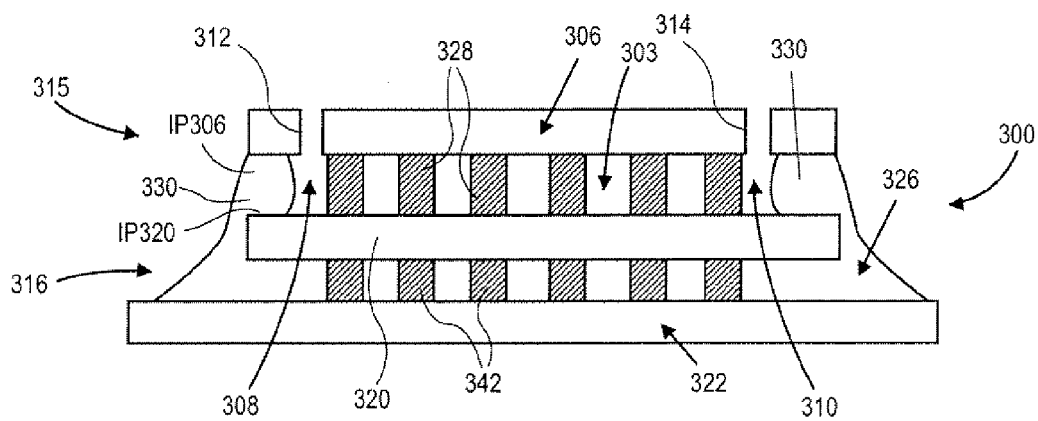
FIG. 3 depicts a microelectronic assembly including a bonding post cold plate according to a second embodiment.

Referring now to FIG. 3, an assembly 300 is shown according to a second embodiment of the present invention. As shown in FIG. 3, assembly 300 may include a package 316 comprising a die 320 bonded to a substrate 322 via electrically conductive and mechanically bonding joints 324 as shown. Bonding joints 324 may be made of the same material as bonding joints 224 described above, and are configured to connect electrical contacts on the underside of die 320 to corresponding electrical contacts on the substrate 322. Joints 324 are encapsulated by a cured underfill material 326 as shown. A cover plate 306 may be provided which is mechanically bonded to a backside of die 320 by way of bonding posts 328, similar to bonding posts 228 in assembly 200 of FIG. 2. The cover plate 306 may be made of the same material as cover plate 206 described above. Bonding posts 328 may further be made of any of the materials listed for joints 324 above. Cured underfill material 326 may include a sealant body in the form of a cured underfill material extension 330 which may be disposed between the cover plate 306 and die 320 to provide a sealing bond between an inner periphery IP306 of cover plate 306 with a facing inner periphery IP320 of die 320 as shown. A combination of the cover plate 306, die 320, and sealant body 330 may thus be configured to define a cooling fluid chamber 303 as shown. In addition, a combination of the cover plate 306, die 320, sealant body 330 and bonding posts 328 may be configured to define a microelectronic cooling device in the form of bonding post cold plate (BPCP) 315 adapted to cool the die 320. Thus, cooling fluid, such as, for example, water, antifreeze (e.g. potassium formate and K-formate), oil, liquid metal, low-melting-temperature solder alloy, nanofluid (that is, fluid with nano-particles), air or helium, may be adapted pass through BPCP 315 by being delivered to an inlet side 308 of chamber 303 by way of an inlet opening 312 in cover plate 306, to flow within chamber 303 between bonding posts 328, and to exit an outlet side 310 of chamber 303 through an outlet opening 314 in cover plate 306 to cool the die.

Figure 4:
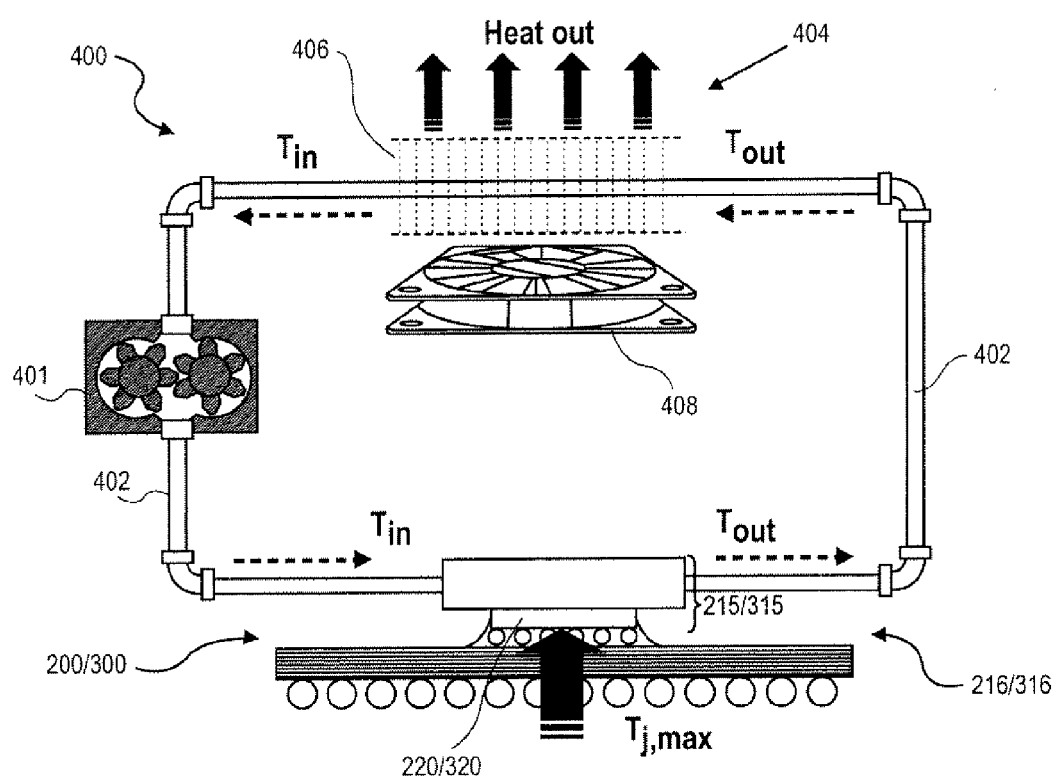
FIG. 4 depicts a cooling loop including a microelectronic assembly according to embodiments.

The embodiments of FIGS. 2 and 3 may be used in a package cooling loop 400 as shown in FIG. 4. Referring then to FIG. 4, an assembly 200/300 as shown in FIGS. 2/3 may be connected to a conventional cooling loop 400 as shown. Cooling loop 400 may include a closed loop cooling fluid circulation path including cooling fluid conduits 402 adapted to direct cooling fluid flow within the loop. The cooling loop 400 may be adapted to circulate cooling fluid at a first temperature $T_{in}$ into BPCP 215/315 of assembly 200/300 to cool the die 220/320 of the assembly. It is noted by way of explanation that, in the context of FIG. 4, when an element is referred to by a reference numeral stated in the alternative, such as, for example, "200/300," what is meant in the context of the instant description is that reference is being made either to element 200 or to element 300 as appropriate. Thus, referring to FIG. 4, cooling fluid may circulate within loop 400 by way of a pump 401 as shown. The cooling fluid may leave BPCP 215/315 at a temperature $T_{out}$, and be driven by pump 401 within conduits 402 into a heat exchanger 404 including a finned heat dissipation device 406 and a fan 408, as would be recognized by one skilled in the art. As a result of being driven through heat exchanger 404, a temperature of the cooling fluid may then drop to $T_{in}$, and the cooling fluid may then be driven in conduits 402 back into pump 401. It is noted that loop 400 described above is one of many loops that may be used to drive cooling fluid through a BPCP according to embodiments, such as, for example, BPCP 215/315 described above.

Referring next to FIG. 5a-5c, 6 and 7, stages of fabrication are depicted to form an assembly according to the embodiment of FIG. 2 or the embodiment of FIG. 3. In particular, while the stages depicted in FIGS. 5a-5c pertain to both embodiments of FIGS. 2 and 3, the stage shown in FIG. 6 pertains in particular to the embodiment of FIG. 2, and the stage shown in FIG. 7 pertains in particular to the embodiment of FIG. 3. The stages in FIGS. 5a-5c, 6 and 7 will be described in further detail below.

Figure 5A:
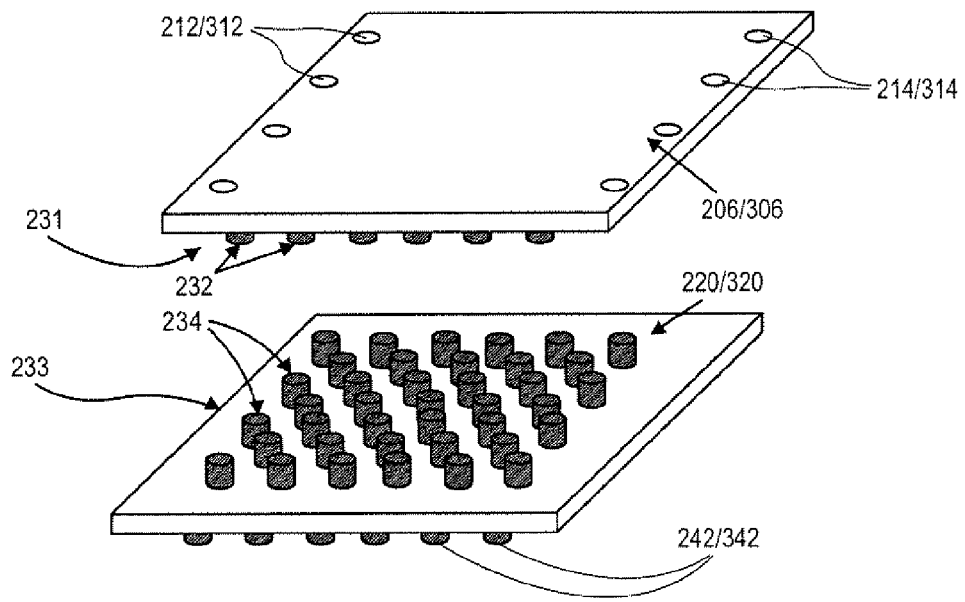
FIGS. 5a-5c depict stages in fabricating an assembly according to embodiments.

As shown in FIG. 5a, according to embodiments, a method of fabricating an assembly may include providing a pattern of pre-post bumps on at least one of a die side of the cover plate and a backside of the die. In the embodiment of FIG. 5a, a method embodiment may include providing a pattern of pre-post bumps on an underside of the cover plate and a corresponding pattern of pre-post bumps on a backside of the die as shown. For example, the embodiment method may include providing a pattern 231/331 of pre-post bumps 232/332 on an underside of the cover plate 206/306 and a corresponding pattern 233/333 of pre-post bumps 234/334 on a backside of the die 220/320 as shown in FIG. 5a. Patterns 231/331 and 233/333 correspond to one another in that, when cover plate 206/306 including bumps 232/332 thereon is disposed on the backside of die 220/320 including bumps 234/334 thereon, each respective one of bumps 232/332 may be disposed in registration with a corresponding one of bumps 234/334. It is noted that, as shown in FIG. 5a, cover plate 206/306 may include a plurality of inlets 212/312 and a plurality of outlets 214/314. As used herein, "pre-post bumps" refer to bumps made of a material that, when disposed between a first and a second element and subjected to conventional bump bonding processes, such as, by way of example, flip chip die bump bonding processes, form posts between the first and second elements that mechanically bond the first and second element to one another. Examples of pre-post bumps according to embodiments may include bumps made of any material used in flip-chip die bonding processes, such as, for example, pre-solder bumps, copper bumps, tin bumps and silver bumps. As shown in FIG. 5a, pre-connection bumps 242/342 may further be provided according to an embodiment on the die 220/320 before bonding the cover plate 206/306 to the die 220/320, although embodiments are not so limited. "Pre-connection bumps" as used herein refer to bumps that, when reflowed and solidified through conventional techniques, such as compression and heat treatment, form joints between die and substrate that are electrically conductive and that further mechanically bond the die to the substrate.

Figure 5B:
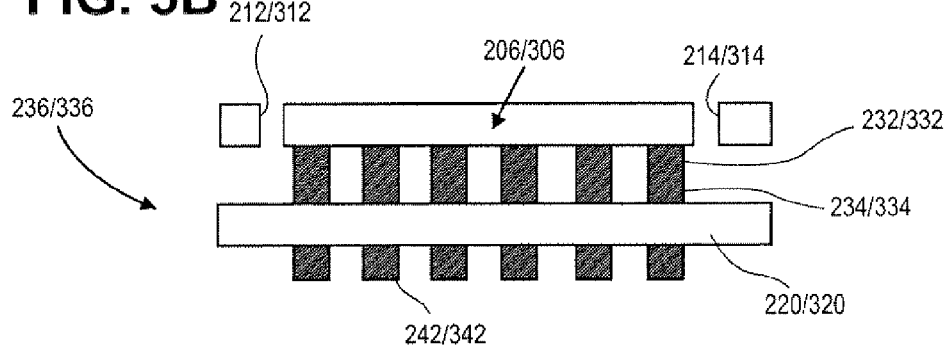
Figure 5C:
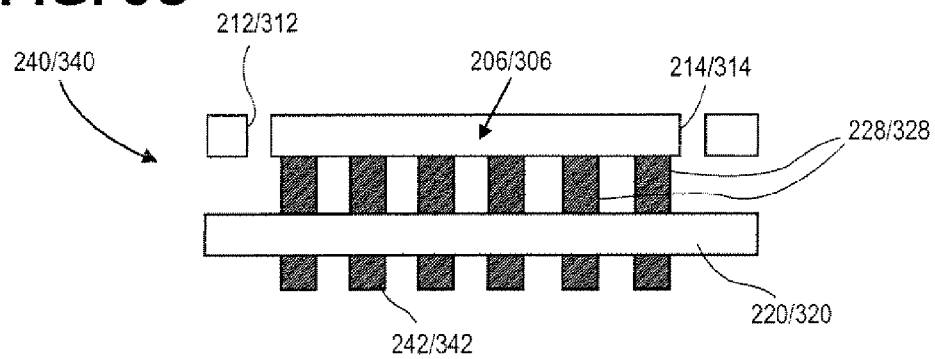

Referring next to FIGS. 5b and 5c, according to embodiments, a method of fabricating an assembly may include bonding the cover plate to the die by: disposing the cover plate on the backside of the die such that the pre-post bumps are disposed between the cover plate and the die to form a cover plate-die combination; and subjecting cover-plate-die combination to a bonding process to form bonding posts from the pre-post bumps. In one embodiment, disposing the cover plate on the backside of the die may include disposing the cover plate on the backside of the die such that a pattern of pre-post bumps on the cover plate is in registration with the pattern of pre-post bumps on the backside of the die to form the cover plate-die combination. Thus, as seen in FIG. 5b, the embodiment method may comprise disposing the cover plate 206/306 on the backside of the die 220/320 such that the pattern 231/331 of pre-post bumps 232/332 on the cover plate 206/306 is in registration with and in contact with the pattern 233/333 of pre-post bumps 234/334 on the backside of the die 220/320 to form a cover plate-die combination 236/336. As next seen in FIG. 5c, the embodiment method may further comprise subjecting cover-plate-die combination 236/336 to a bonding process to form bonding posts 228/328 from the pre-post bumps 232/332 and 234/334. Bonding the cover plate to the die according to embodiments results in a bonded cover-plate-die combination such as bonded cover-plate-die combination 240/340 shown in FIG. 5c. According to embodiments, subjecting the cover-plate-die combination to a bonding process may include any one of well known processes for bonding a die to a substrate, such as, for example, any one of well known flip-chip bump bonding processes. According to an embodiment, a thermal compression bonder may be used to subject the cover-plate-die combination to a bonding process, as would be recognized by one skilled in the art.

Figure 6:
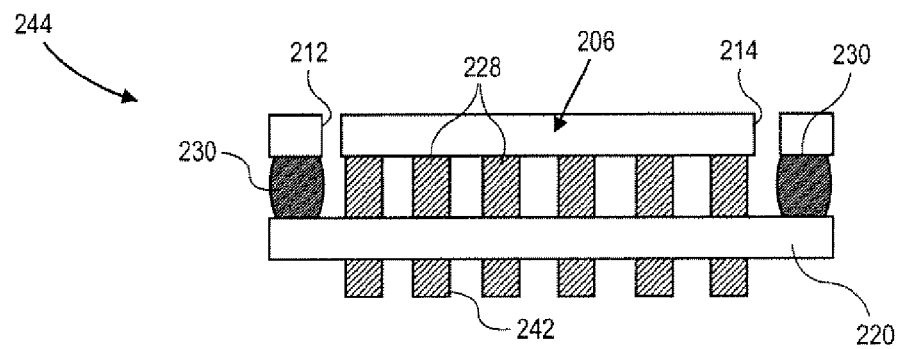
FIG. 6 depicts a stage in fabricating the assembly of FIG. 2.
Figure 7:
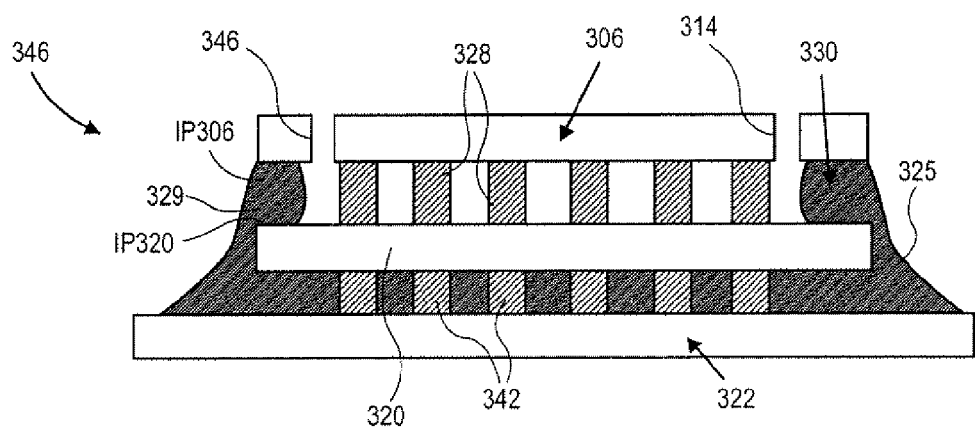
FIG. 7 depicts a stage in fabricating the assembly of FIG. 3.

Referring next to FIGS. 6 and 7, according to embodiments, a method of fabricating an assembly may include providing a sealant body between the cover plate and the die to join an inner periphery of the cover plate with a facing inner periphery of the die to obtain a sealed bonded cover-plate-die combination. The provision of the sealant body according to FIGS. 6 and 7, as it relates to the fabrication of assemblies of FIGS. 2 and 3 respectively, will be described in further detail below. A function of the sealant body is to define the cooling chamber along with the die and cover plate such that cooling fluid adapted to circulate within the cooling chamber is sealed by the sealant body against existing the cooling chamber except through one or more outlet openings defined to access the cooling chamber.

According to a method embodiment as shown in FIG. 6, a sealant body 230 may be provided between the cover plate 206 and die 220 to join the inner periphery IP206 of cover plate 206 with the facing inner periphery IP220 of die 220 as shown to obtain a sealed bonded cover-plate-die combination 244. A combination of the cover plate 206, die 220, and sealant body 230 may thus be configured to define the cooling fluid chamber. The sealant body 230 may, according to some embodiments, comprise an adhesive, such as, for example, epoxy or solder, in solidified form. The sealant body 230 may further, according to some embodiments, be provided for example by dispensing a pre-sealant fluid between the facing inner peripheries of the cover-plate and die in fluid form such that the pre-sealant fluid adheres to the facing inner peripheries by virtue of capillary forces acting thereon, and by thereafter curing the pre-sealant fluid to obtain the sealant body therefrom. Curing of the pre-sealant fluid, according to embodiments, is a function of the pre-sealant fluid used, and may involve, by way of example, air drying, subjecting the pre-sealant fluid to high temperatures and/or high pressures, as would be recognized by one skilled in the art.

Referring back to FIG. 2, according to embodiments, a method of fabricating an assembly may include bonding the sealed bonded cover-plate-die combination to a substrate to obtain the assembly. According to an embodiment, bonding the sealed bonded cover-plate-die combination may include providing pre-connection bumps on a front side of the die, disposing the sealed bonded cover-plate-die combination on the substrate such that the pre-connection bumps are disposed between the die and the substrate to form a bonded cover-plate-die-substrate combination; and subjecting the bonded cover-plate-die-substrate combination to a bonding process to form joints from the pre-connection bumps to obtain the assembly, such as assembly 200 of FIG. 2, including BPCP 215 as described above. Thus, referring back to FIGS. 5a and 2, pre-connection bumps 242 on die 220 may be provided. Examples of pre-connection bumps according to embodiments may include bumps made of any material used in flip-chip die bonding processes, such as, for example, pre-solder bumps, copper bumps, tin bumps and silver bumps. Referring again to FIG. 2, the pre-connection bumps 242 thus result in the formation of joints 224 as a result of subjecting the cover-plate-die-substrate combination to a bonding process. According to embodiments, subjecting the bonded cover-plate-die-substrate combination to a bonding process may include any one of well known processes for bonding a die to a substrate, such as, for example, any one of well known flip-chip bump bonding processes. According to an embodiment, a thermal compression bonder may be used to subject the cover-plate-die-substrate combination to a bonding process, as would be recognized by one skilled in the art.

As next seen in FIG. 7, according to a method embodiment, a sealant body 330 comprising cured underfill material may be provided between the cover plate 306 and die 320 to join the inner periphery IP306 of cover plate 306 with the facing inner periphery IP320 of die 320 as shown. A combination of the cover plate 306, die 320, and sealant body 330 may thus be configured to define the cooling fluid chamber. The sealant body may further, according to some embodiments, be provided for example by dispensing an underfill material 329 in uncured form between the facing inner peripheries of the cover-plate and die such that the underfill material in uncured form adheres to the facing inner peripheries by virtue of capillary forces acting thereon, and by thereafter curing the underfill material according to conventional methods to obtain the sealant body 330 therefrom. The underfill material may comprise any suitable underfill material as would be within the knowledge of one skilled in the art. Curing of the underfill material, according to embodiments may involve, by way of example, subjecting the underfill material in uncured form to high temperatures and/or high pressures, as would be recognized by one skilled in the art. Preferably, according to embodiments, and referring to both FIGS. 7 and 3, provision of a sealant body 330 comprising cured underfill material may include providing uncured underfill material on the substrate; disposing the bonded cover-plate-die combination 340 on the substrate to form a cover-plate-die-substrate combination 346 such that the pre-connection bumps are disposed between the die and the substrate, and such that some of the uncured underfill material 329 adheres to the facing inner peripheries of the cover plate IP306 and of the die IP320 by virtue of capillary forces acting on the uncured underfill material; and thereafter subjecting the cover-plate-die-substrate combination 346 to a bonding process to form joints 324 from the pre-connection bumps 342 to obtain the sealant body 330 from the underfill material 329 adhering to the facing inner peripheries as noted above, thus forming the assembly 300 including BPCP 315 described above. According to embodiments, subjecting the cover-plate-die-substrate combination to a bonding process may include any one of well known processes for bonding a die to a substrate, such as, for example, any one of well known flip-chip bump bonding processes. According to an embodiment, a thermal compression bonder may be used to subject the cover-plate-die-substrate combination to a bonding process, as would be recognized by one skilled in the art. In addition, embodiments of the present invention also encompass further curing of the underfill material after joint formation such as by exposing the underfill material to elevated temperatures, such as in a cure oven as would be recognized by one skilled in the art.

It is noted that although the above-described embodiments depict pre-post bumps and posts that are disposed in registration for pre-connection bumps and joints on the front side of the die, embodiments of the present invention are not so limited. In fact, according to embodiments, the assembly may be fabricated such that the posts of the BPCP may be disposed according to any desired distribution density and desired pattern between the die and the cover plate according to application needs. Thus, the posts may have a distribution density and pattern that is chosen based on application needs, such as, for example, cooling needs of the die. It is therefore not required according to embodiments that the posts be disposed according to a uniform distribution density and/or a regular pattern between the cover plate and die. According to some embodiments, the posts may therefore be disposed at densities that vary across a space between the cover plate and the die, such as according to cooling needs of the die. According to some embodiments, the posts may further be disposed according to a pattern that varies across a space between the cover plate and the die, such as according to cooling needs of the die. For example, it is noted that a heat transfer coefficient of a cold plate is inversely proportional to its effective hydraulic diameter. When the cold plate is a MCCP according to the prior art, for example, as the size of the channels is reduced, the effective hydraulic diameter reduced as a result, and, consequently, the heat transfer coefficient of the MCCP increases. An effective hydraulic diameter of a BPCP according to embodiments may be experimentally determined. As a general rule, an increase in the number of posts results in a decrease in the effective hydraulic diameter, and an increase in the heat transfer coefficient in question. Thus, according to an embodiment, a number of posts may be increased in areas of the BPCP that are adapted to correspond to hot spots on the die. In addition, the posts may have any shape or cross-section to affect a cooling ability of the BPCP including the posts. Moreover, it is noted that embodiments of the present invention encompass a fabrication of an assembly such as assembly 200 of FIG. 2 or assembly 300 of FIG. 3 where the posts and the joints are formed in sequence as described above, or, in the alternative, simultaneously.

Advantageously, embodiments of the present invention provide an efficient, cost-effective, simple device for providing thermal management for a die. A device according to embodiments advantageously allows an even distribution of cooling fluid within its cooling chamber, thus providing an improved heat transfer coefficient. Additionally, a device according to embodiments may be advantageously manufactured according to known techniques, thus obviating the need for additionally tools. Moreover, embodiment methods advantageously provide a simple manner of fabricating a device for providing thermal management for a die by allowing flexibility in changing design parameters by merely adjusting post size and pitch according to application needs.

Figure 8:
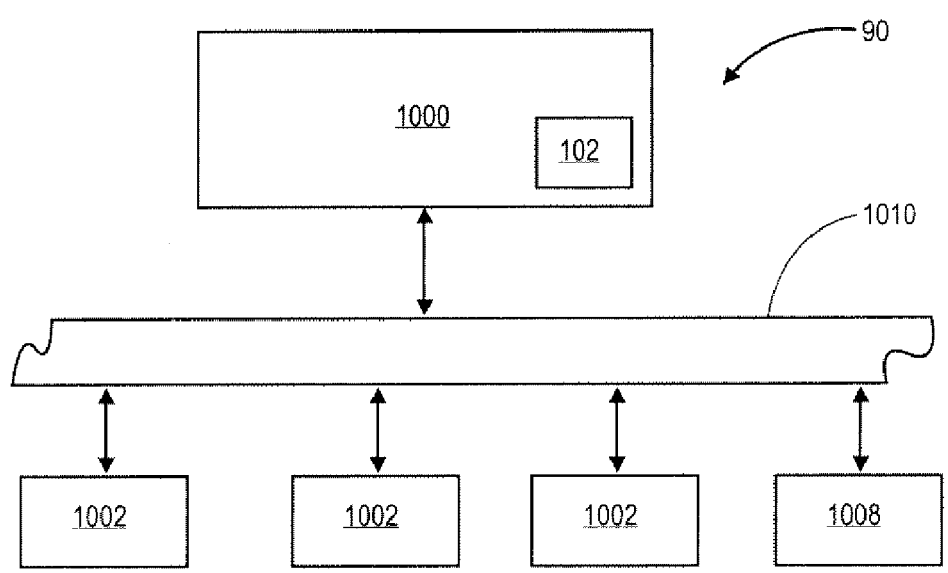
FIG. 8 depicts a system including a microelectronic assembly according to embodiments.

Referring to FIG. 8, there is illustrated one of many possible systems 90 in which embodiments of the present invention may be used. The microelectronic assembly 1000 may be similar to the microelectronic assembly 200 or 300 depicted above in FIG. 2 or 3, respectively. In one embodiment, the electronic assembly 1000 may include a microprocessor. In an alternate embodiment, the electronic assembly 100 may include an application specific IC (ASIC). Integrated circuits found in chipsets (e.g., graphics, sound, and control chipsets) may also be packaged in accordance with embodiments of this invention.

For the embodiment depicted by FIG. 8, the system 90 may also include a main memory 1002, a graphics processor 1004, a mass storage device 1006, and/or an input/output module 1008 coupled to each other by way of a bus 1010, as shown. Examples of the memory 1002 include but are not limited to static random access memory (SRAM) and dynamic random access memory (DRAM). Examples of the mass storage device 1006 include but are not limited to a hard disk drive, a compact disk drive (CD), a digital versatile disk drive (DVD), and so forth. Examples of the input/output module 1008 include but are not limited to a keyboard, cursor control arrangements, a display, a network interface, and so forth. Examples of the bus 1010 include but are not limited to a peripheral control interface (PCI) bus, and Industry Standard Architecture (ISA) bus, and so forth. In various embodiments, the system 90 may be a wireless mobile phone, a personal digital assistant, a pocket PC, a tablet PC, a notebook PC, a desktop computer, a set-top box, a media-center PC, a DVD player, and a server.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A microelectronic assembly comprising:
   a microelectronic package including a substrate and a die, the die being electrically conductively bonded to the substrate at a front side thereof and further having a backside;
   a cover plate defining an inlet opening and an outlet opening therethrough;
   bonding posts mechanically bonding the cover plate to the backside of the die;
   a sealant body sealingly bonding an inner periphery of a die side of the cover plate to an inner periphery of a backside of the die to form, along with the backside of the die and the cover plate, a cooling fluid chamber, the bonding posts extending within the cooling chamber from the backside of the die to the die side of the cover plate, and the sealant body being disposed between the backside of the die and the die side of the cover plate;
   wherein the backside of the die, the cover plate, the bonding posts and the sealant body together define a microelectronic cooling device including the cooling fluid chamber and configured to receive cooling fluid through the inlet opening, to flow the cooling fluid in the chamber between the bonding posts, and to allow the cooling fluid to exit from the outlet opening to cool the die.

2. The assembly of claim 1, wherein the bonding posts are made of one of solder, copper, tin, silver, gold, and alloys including any combination of tin, bismuth, lead and/or indium.

3. The assembly of claim 1, wherein the bonding posts have at least one of a curved and a polygonal cross-section in a plane perpendicular to their longitudinal directions.

4. The assembly of claim 1, wherein the bonding posts are disposed according to a regular pattern across a space between the cover plate and the die.

5. The assembly of claim 1, wherein the bonding posts are disposed according to a pattern that varies across a space between the cover plate and the die.

6. The assembly of claim 1, wherein the bonding posts are disposed according to a uniform distribution density across a space between the cover plate and the die.

7. The assembly of claim 1, wherein the bonding posts are disposed according to a distribution density that varies across a space between the cover place and the die.

8. The assembly of claim 1, wherein the bonding posts are disposed according to at least one of a pattern and a distribution density that vary across a space between the cover plate and the die as a function of cooling needs of the die.

9. The assembly of claim 8, wherein the bonding posts are disposed according to a distribution density that increases at locations between the cover plate and the die that correspond to hot spots of the die.

10. The assembly of claim 1, further comprising bonding joints and a cured underfill material disposed between the die and the substrate to bond the die to the substrate.

11. The assembly of claim 1, wherein the cover plate is made of one of silicon and glass.

12. The assembly of claim 1, wherein the sealant body comprises a cured adhesive.

13. The assembly of claim 10, wherein the sealant body comprises a cured underfill material extension of the cured underfill material.

14. A microelectronic sealed bonded cover plate-die combination comprising:
    a die;
    a cover plate defining an inlet opening and an outlet opening therethrough;
    bonding posts mechanically bonding the cover plate to the backside of the die;
    a sealant body sealingly bonding an inner periphery of a die side of the cover plate to an inner periphery of a backside of the die to form, along with the backside of the die and the cover plate, a cooling fluid chamber, the bonding posts extending within the cooling chamber from the backside of the die to the die side of the cover plate, and the sealant body being disposed between the backside of the die and the die side of the cover plate;
    wherein the backside of the die, the cover plate, the bonding posts and the sealant body together define a microelectronic cooling device including the cooling fluid chamber and configured to receive cooling fluid through the inlet opening, to flow the cooling fluid in the chamber between the bonding posts, and to allow the cooling fluid to exit from the outlet opening to cool the die.

15. The combination of claim 14, wherein the bonding posts are made of one of solder, copper, tin, silver, gold, and alloys including any combination of tin, bismuth, lead and/or indium.

16. A system comprising:
    a microelectronic assembly comprising:
       a microelectronic package including a substrate and a die, the die being electrically conductively bonded to the substrate at a front side thereof and further having a backside;
       a cover plate defining an inlet opening and an outlet opening therethrough;
       bonding posts mechanically bonding the cover plate to the backside of the die;
       a sealant body sealingly bonding an inner periphery of a die side of the cover plate to an inner periphery of a backside of the die to form, along with the backside of the die and the cover plate, a cooling fluid chamber, the bonding posts extending within the cooling chamber from the backside of the die to the die side of the cover plate, and the sealant body being disposed between the backside of the die and the die side of the cover plate;
       wherein the backside of the die, the cover plate, the bonding posts and the sealant body together define a microelectronic cooling device including the cooling fluid chamber and configured to receive cooling fluid through the inlet opening, to flow the cooling fluid in the chamber between the bonding posts, and to allow the cooling fluid to exit from the outlet opening to cool the die; and
    a memory device coupled to the assembly.

17. The system of claim 16, wherein the bonding posts are made of one of solder, copper, tin, silver, gold, and alloys including any combination of tin, bismuth, lead and/or indium.

* * * * *